(12) United States Patent
Murr

(10) Patent No.: US 6,905,377 B2
(45) Date of Patent: Jun. 14, 2005

(54) CONTACT FOR LAND GRID ARRAY SOCKET

(75) Inventor: Keith M. Murr, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/245,487

(22) Filed: Sep. 17, 2002

(65) Prior Publication Data

US 2004/0053541 A1 Mar. 18, 2004

(51) Int. Cl.[7] .............................................. H01R 4/48
(52) U.S. Cl. ........................ 439/862; 439/71; 439/330; 439/515
(58) Field of Search ......................... 439/862, 71, 330, 439/575

(56) References Cited

U.S. PATENT DOCUMENTS

| | | | | |
|---|---|---|---|---|
| 4,555,153 A | * | 11/1985 | Bricaud et al. | ............... 439/71 |
| 4,857,001 A | | 8/1989 | Nakano et al. | |
| 5,320,551 A | * | 6/1994 | Mori et al. | ................. 439/266 |
| 5,453,019 A | * | 9/1995 | Garver et al. | ............... 439/188 |
| 5,688,140 A | | 11/1997 | McHugh et al. | |
| 6,019,611 A | | 2/2000 | McHugh et al. | ............... 439/71 |
| 6,164,978 A | * | 12/2000 | McHugh et al. | ............... 439/66 |
| 6,210,176 B1 | * | 4/2001 | Hsiao | .......................... 439/71 |
| 6,227,869 B1 | * | 5/2001 | Lin et al. | ...................... 439/66 |
| 6,512,861 B2 | * | 1/2003 | Chakravorty et al. | ......... 385/14 |
| 6,572,386 B1 | | 6/2003 | Howell et al. | ................. 439/66 |
| 2002/0111052 A1 | | 8/2002 | Noda et al. | |

* cited by examiner

Primary Examiner—Chau N. Nguyen
Assistant Examiner—Jinhee Lee

(57) ABSTRACT

A contact is provided for use in a land grid array (LGA) socket. The contact includes a support body defining a support body plane. The support body is configured to be held in a hole in an LGA socket and has opposed side edges. The contact also includes a contact beam having a base portion projecting from one of the side edges. The base portion extends along a base axis and has an upper end joined at a deflectable bend with an outer portion of the contact beam. The outer portion is configured to have surface mounted thereon an adjoining contact, and the outer portion projects from the bend at a first angle with respect to the base axis and at a second angle with respect to the support body plane.

19 Claims, 8 Drawing Sheets

CONTACT FOR LAND GRID ARRAY SOCKET

BACKGROUND OF THE INVENTION

Certain embodiments of the present invention generally relate to a contact configured to deflect across a defined vertical range while electrically connecting a circuit board to a processor.

Many large electronic devices, such as computers, use sockets to connect different electronic components. For example, pin grid array (PGA) sockets are used to electrically connect electronic packages, such as processors, to printed circuit boards. PGA sockets facilitate electrical communication between a large number of pins on the processor and contacts on the circuit board. PGA sockets may utilize a cover that is slidably movable on a base between open and closed positions. The sliding movement may be actuated, for example, by a lever. The cover has a hole array configured to match a pin array on the processor. Similarly, the base has an array of pin receiving chambers configured to accept the pin array of the processor. The processor is mated to the socket by first placing the processor such that its pins slide into the holes of the cover. With the cover in the open position, the processor pins pass through the holes of the cover into the pin receiving chambers of the base, but are not electrically connected to the pin receiving chambers of the base.

When the cover is slid to the closed position, the processor pins electrically connect to contacts in the pin receiving chambers in the base. The contacts have fingers that flexible receive the processor pins therebetween. This PGA base and cover arrangement, however, requires use of a mechanism, such as a lever assembly, thereby introducing excess parts and manufacturing cost. The PGA base and cover arrangement also requires additional space for the contacts as the fingers on the contacts must flex outward away from each other to receive the processor pins. These drawbacks are especially troublesome in applications where space is at a premium, such as on motherboards for desktop and laptop computers.

Consequently, land grid array (LGA) sockets have been developed which require only vertical compression to allow a processor and circuit board to electrically communicate. The LGA sockets do not require the lever mechanism, and can be used in applications with more stringent space requirements. LGA sockets, however, require a vertical compression force to be continuously applied to the processor to maintain proper communication between the processor and the circuit board.

One LGA socket has been proposed in an application, entitled "Surface Mount Technology Land Grid Array Socket," filed on Aug. 5, 2002, and afforded Ser. No. 10/212,414. FIGS. 1 and 2 illustrate the above-noted electrical system 10 including a surface mount land grid array (LGA) socket 11. The electrical system 10 also includes a circuit board 12 to which the socket 11 is mounted and a processor 18 mounted to the socket 11. The socket 11 includes a frame 14, a housing 16 (see FIG. 2), and bias spring arms 20. The frame 14 includes an array of holes 86 therein that hold socket contacts in a pattern that corresponds to a pattern of contacts provided on the bottom of the processor 18. The bias spring arms 20 locate and position the processor 18 with respect to the socket 11 such that the processor contacts align and engage socket contacts to facilitate electrical communication between the processor 18 and the circuit board 12. When the housing 16 is positioned in the frame 14 and the processor 18 is positioned on the housing 16, the processor and socket contacts are placed under a desired vertical load between the circuit board and the processor.

However, existing LGA socket contacts have experienced certain limitations, such as an unduly limited range of deflection. More specifically, after the processor is positioned on top of the socket contact, the processor applies a normal vertical force that deflects the socket contact between first and second contact positions. The range of deflection determines certain tolerances of the individual components, such as the socket, processor, and circuit board. Conventional LGA socket contacts have an unduly limited range of deflection which places undesirably narrow limits on the component tolerances. Additionally, conventional socket contacts may not return to their unbiased first position upon removal of the processor while affording the desired deflection range.

A need exists for an LGA socket contact that addresses the above noted problems and others experienced heretofore.

BRIEF SUMMARY OF THE INVENTION

Certain embodiments include an electrical contact for use in a land grid array (LGA) socket. The contact includes a support body defining a support body plane. The support body is configured to be held in a hole in an LGA socket and has opposed side edges. The contact also includes a contact beam having a base portion projecting from one of the side edges. The base portion extends along a base axis and has an upper end joined at a deflectable bend with an outer portion of the contact beam. The outer portion is configured to have surface mounted thereon an adjoining contact, and the outer portion projects from the bend at a first angle with respect to the base axis and at a second angle with respect to the support body plane.

Figure 1:
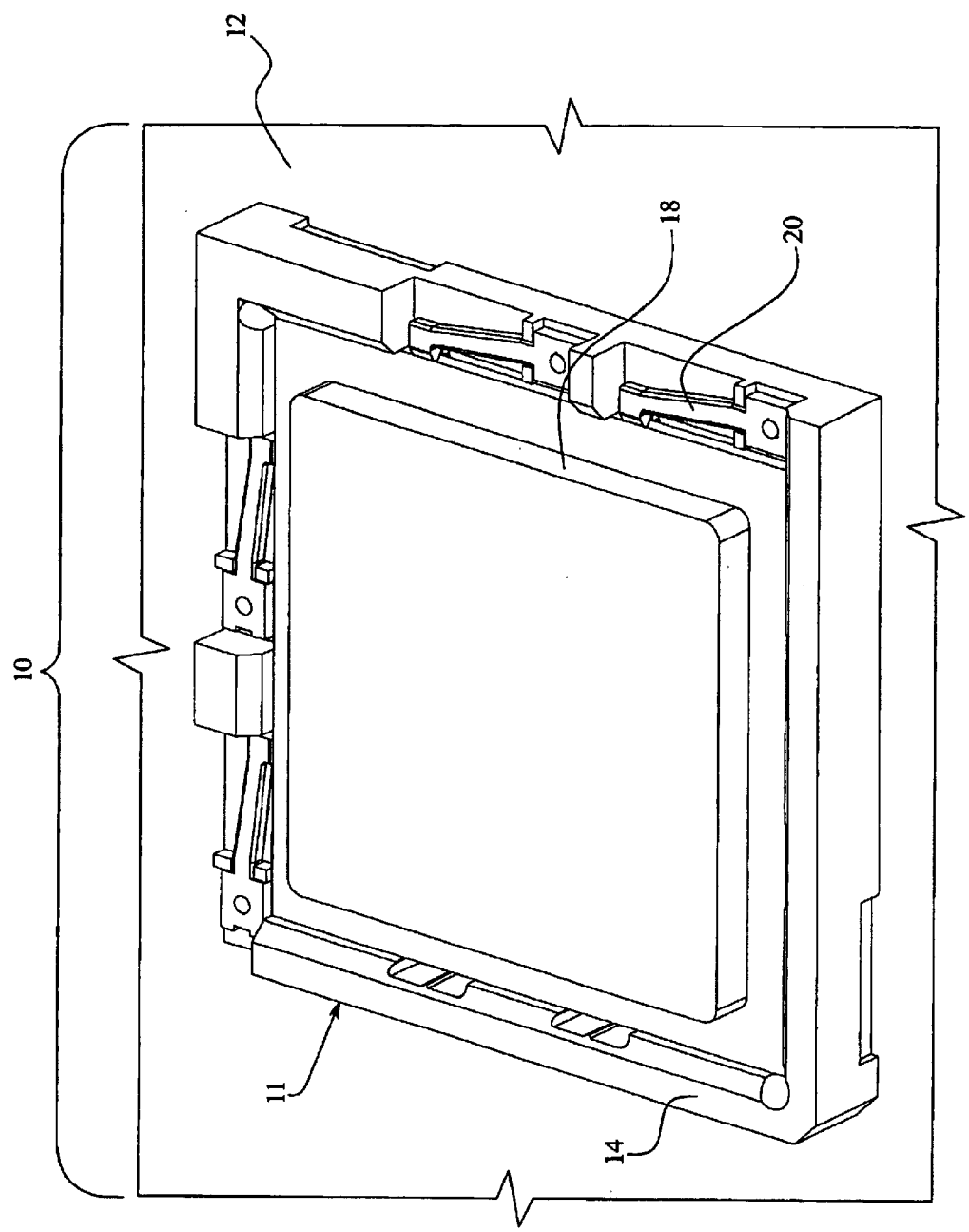
FIG. 1 illustrates an isometric view of an electrical socket system using contacts formed in accordance with an embodiment of the present invention.

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE INVENTION

Figure 2:
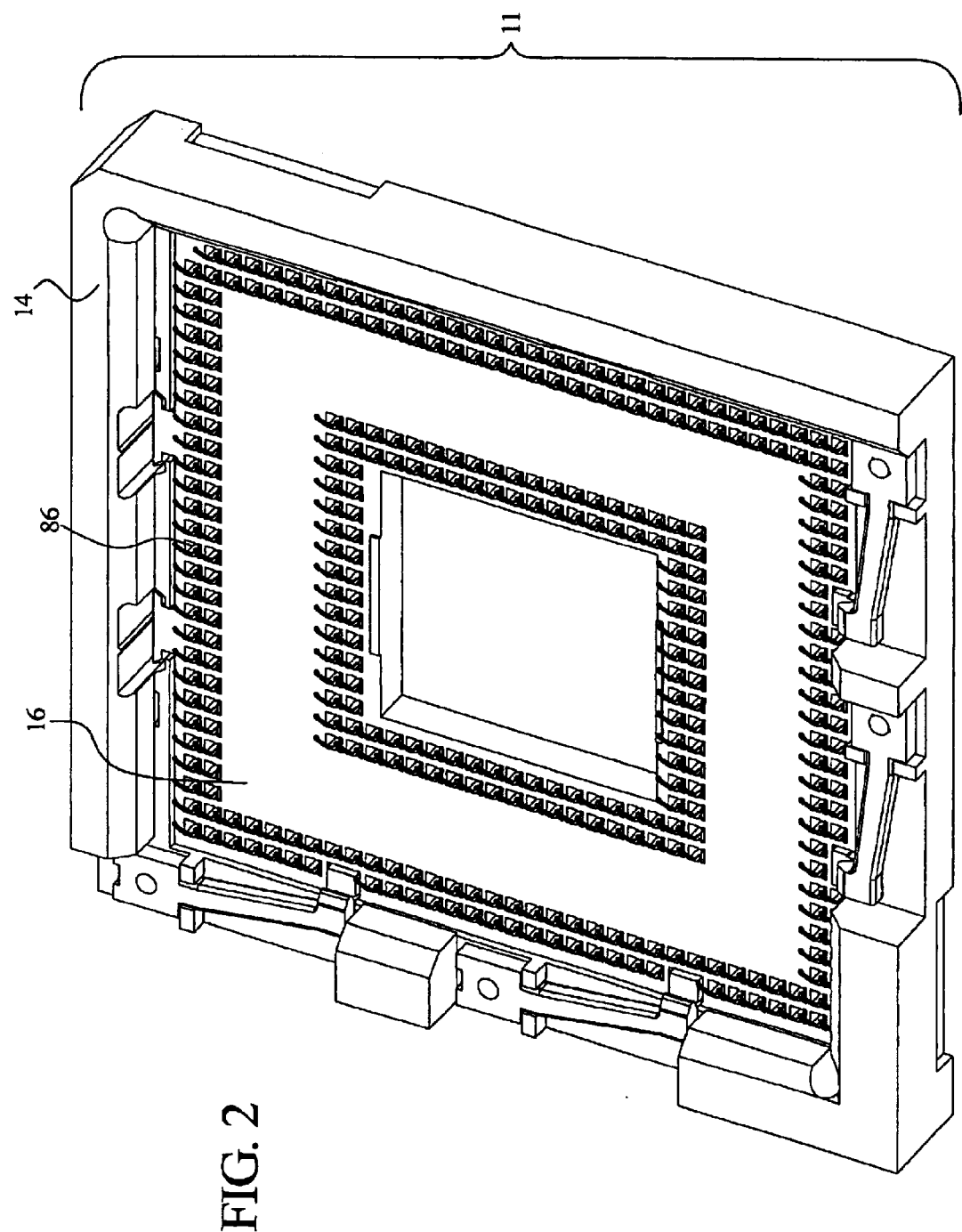
FIG. 2 illustrates an isometric view of a frame holding contacts formed in accordance with and embodiment of the present invention.
Figure 3:
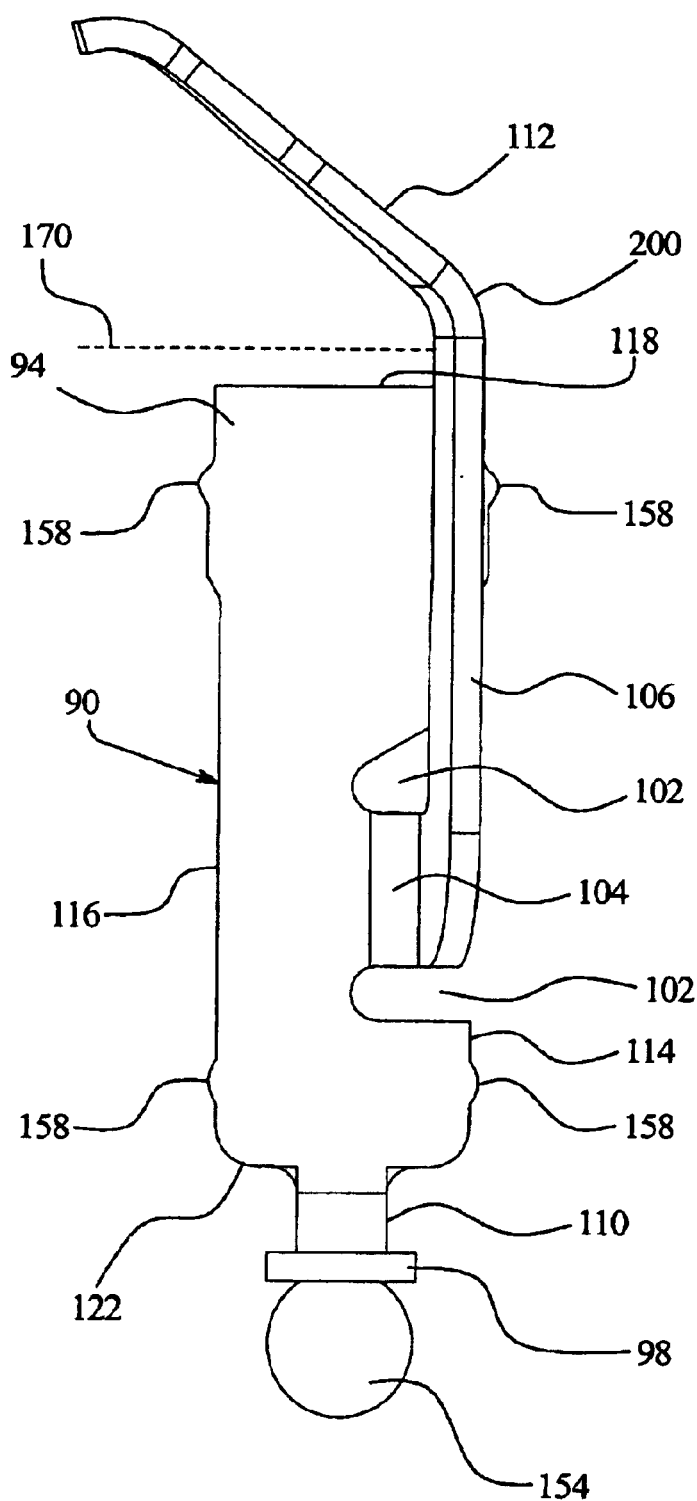
FIG. 3 illustrates a front view of a contact formed according to an embodiment of the present invention.

FIG. 3 illustrates a front view of a contact 90 formed in accordance with an embodiment of the present invention. The contact 90 is metal and has a generally rectangular support body 94 with parallel first and second sides 114 and 116 and parallel top and bottom ends 118 and 122. A curved foot 110 is formed with, and extends from, the bottom end 122 to join a cylindrical solder ball pad 98 with the support body 94 and the solder ball pad 98 oriented perpendicular to each other. The solder ball pad 98 is configured to receive a spherical solder ball 154. In operation, the solder ball 154 is used for mounting the housing 16 (FIGS. 2 and 7) to the circuit board 12 (FIG. 1) and to allow electrical communication between the contact 90 and the circuit board 12. The solder ball 154, for example, may be selected to accommodate either SnPb or Pb free processing. After solder reflow, the solder ball 154 is more oval in shape than shown in FIG. 3. The solder ball pad 98 is flexible to accommodate differences in contraction and expansion between the contact 90 and the circuit board 12.

The rectangular support body 94 has two gaps 102 notched in the first side 114. A curved arm 104 extends laterally from the support body 94 between the gaps 102 and joins a base portion 106. The arm 104 connects the support body 94 and the base portion 106 such that the support body 94 and the base portion 106 are oriented to each other at an angle slightly greater than ninety degrees. By way of example only, the base portion 106 may form a 91–98 degree angle with the support body 94. The base portion 106 extends slightly beyond the top end 118 of the support body 94. A contact beam 112 is formed with, and extends from, the base portion 106 at a bend 200 at a generally forty-five degree angle to the top end 118 of the support body 94 along a horizontal axis 170. In operation, the contact beam 112 extends out of the hole 86 (FIGS. 2 and 7) and is deflected by the processor 18 (FIG. 1).

The support body 94 also has retention bumps 158 formed opposite each other on the first and second sides 114 and 116 and extending outward away from each other. In operation, when the contact 90 is inserted into a hole 86 (FIGS. 2 and 7), the retention bumps 158 resistibly engage walls of the hole 86 to retain the contact 90 within the hole 86. The retention bumps 158 are evenly spaced apart along the first and second sides 114 and 116 and opposite each other on the first and second sides 114 and 116 to evenly distribute the stress imparted on the contact 90 by the walls of the hole 86 and by contact with the circuit board 12 (FIG. 1) and processor 18 (FIG. 1). Thus, the retention bumps 158 prevent the support body 94 from bowing.

Figure 4:
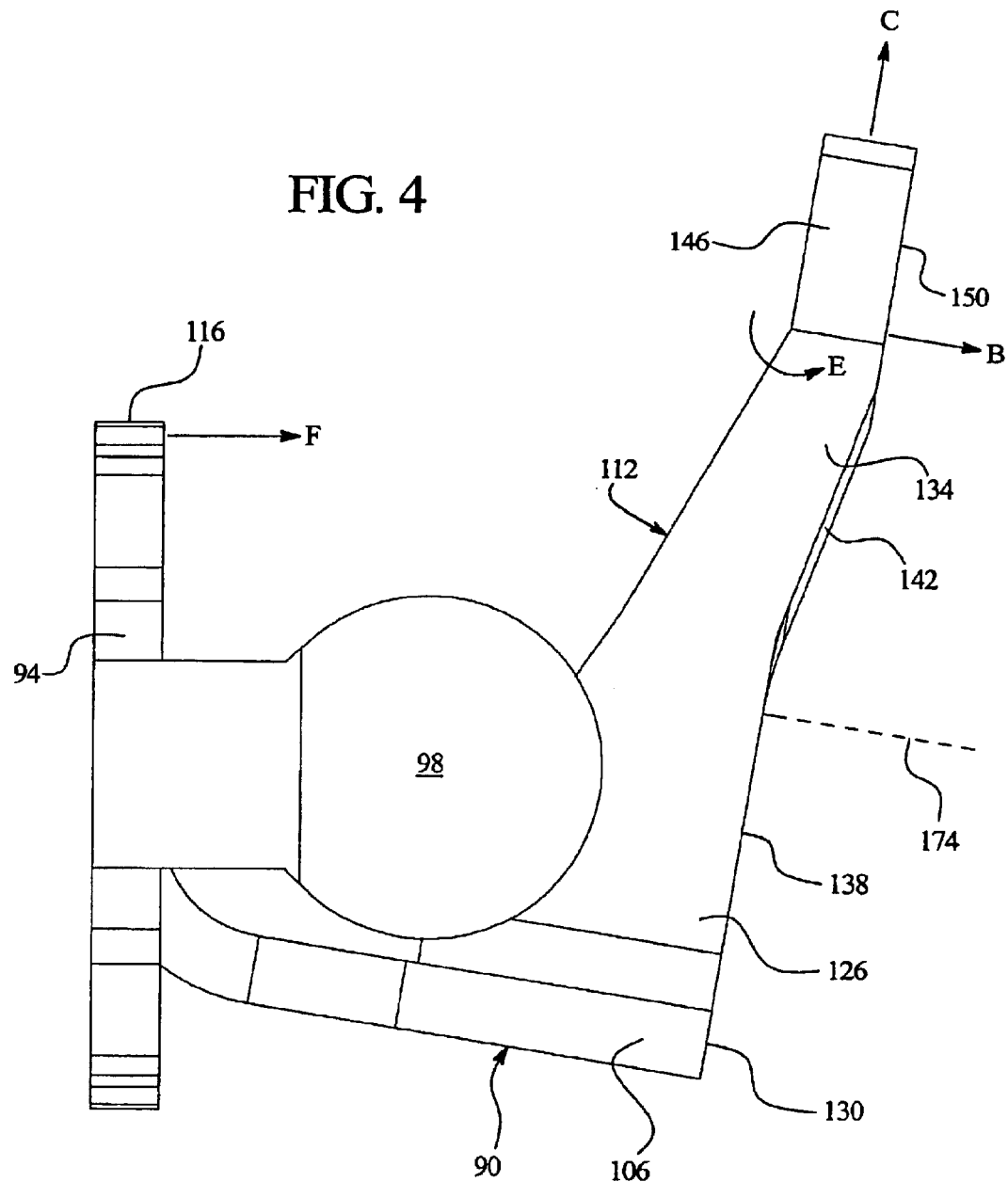
FIG. 4 illustrates a bottom view of a contact formed according to an embodiment of the present invention.

FIG. 4 illustrates a bottom view of the contact 90 of FIG. 3 without the solder ball 154. FIG. 4 better shows the angled orientation of the support body 94 to the base portion 106. During assembly, the contact 90 is inserted into a hole 86 (FIGS. 2 and 7) in the housing 16 (FIGS. 2 and 7) such that the support body 94 and the base portion 106 are retained in the hole 86. Because the hole 86 is generally defined by right angles, the walls of the hole 86 resistibly deflect the support body 94 proximate the second side 116 inward in the direction of arrow F such that the support body 94 and the base portion 106 are oriented at an angle closer to ninety degrees. Thus, the contact 90 is resistibly nested within the hole 86.

Figure 7:
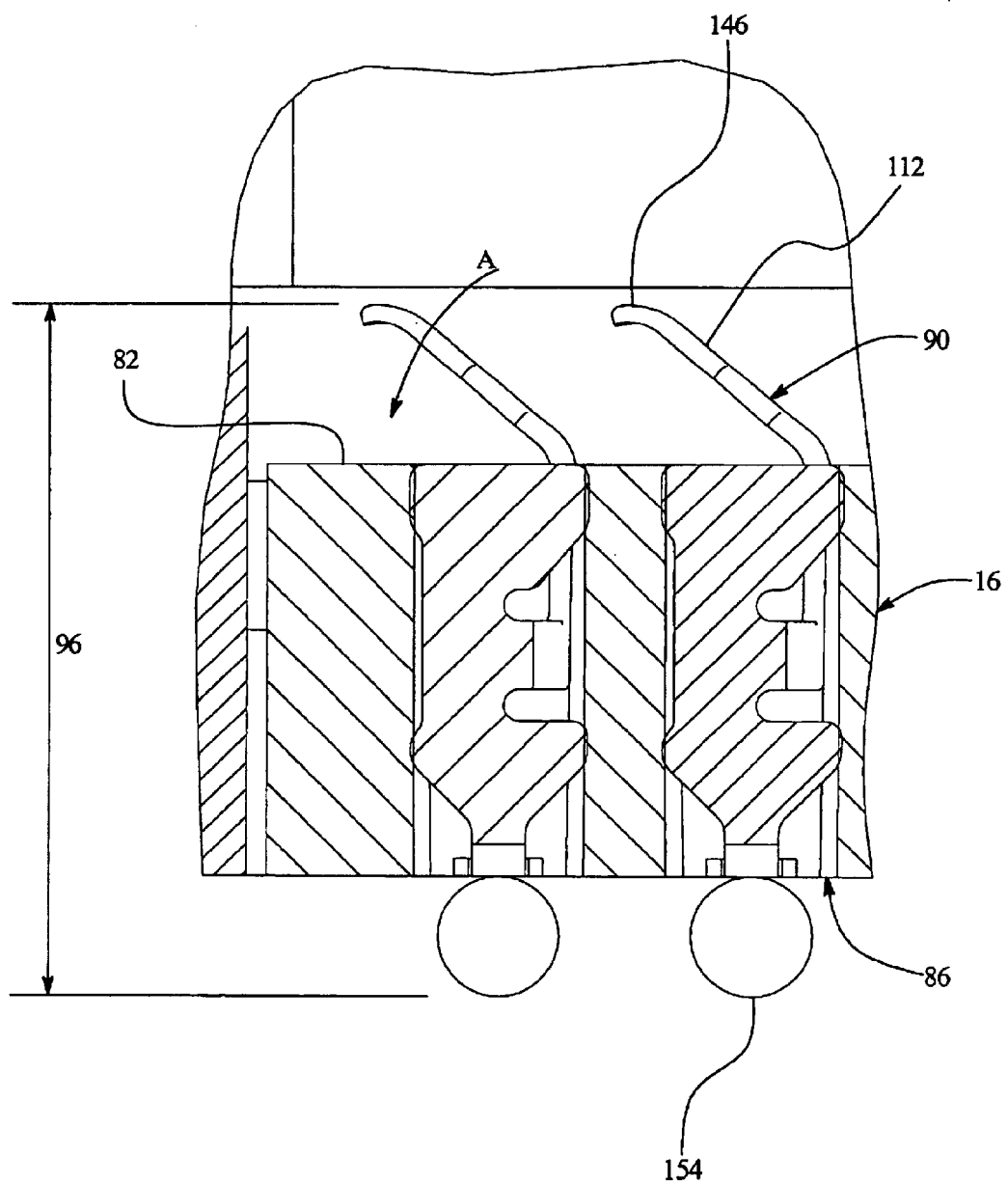
FIG. 7 illustrates a sectional view of a housing showing contacts inside of holes.

Additionally, because the support body 94 and the base portion 106 are oriented at an obtuse angle, the contact 90 takes up less space and can be fitted into a smaller hole 86 (FIGS. 2 and 7). Thus, more holes 86 and more contacts 90 can be fitted into the housing 16 (FIGS. 2 and 7).

The contact beam 112 includes a first segment 126 with an outer side wall 138. The outer side wall 138 is aligned in a plane with an end 130 of the base portion 106. A second segment 134 having an outer side wall 142 extends from the first segment 126 in a direction away from the support body 94. The outer side wall 142 of the second segment 134 forms an obtuse angle with the outer side wall 138 of the first segment 126 along a transverse axis 174. A rectangular contact tip 146 extends from the second segment 134 having an outer side wall 150 that is generally parallel with the outer side wall 138 of the first segment 126.

In operation, the processor 18 (FIG. 1) applies a vertical normal force on the contact tip 146. The vertical normal force deflects the contact beam 112 downward toward the solder ball pad 98 such that the contact beam 112 absorbs a cantilever force where the first segment 126 engages the base portion 106. The vertical normal force also deflects the contact beam 112 such that the contact tip 146 extends forward away from the base portion 106 in the direction of arrow C. However, because of the obtuse angle between the first and second segments 126 and 134, the vertical normal force also applies a torsional force to the second segment 126 in the direction of arrow E such that the contact tip 146 and the second segment 126 are deflected in the direction of arrow B away from the support body 94.

Since the contacts 90 are all retained in an array of rows in the housing 16 (FIGS. 2 and 7) the contact beams 112, if long enough and deflectable only downward and in the direction of arrow C, can be deflected such that adjacent contacts 90 in a row touch each other. Thus, having contact beams 112 that deflect only downward and in the direction of arrow C limits the length of the contact beams 112. However, because the second segment 134 and the contact tip 146 are partially deflected in the direction of arrow B, a longer contact beam 112 can be used to engage the processor 18 (FIG. 1) without the contact beams 112 in adjacent rows touching each other. For example, the contact beam 112 may be as long as the support body 94. The added length of the contact beam 112 makes for a stronger contact beam 112 that can be deflected over a greater vertical range. The added length of the contact beam 112 also makes the contact beam 112 stronger such that the contact beam 112 can reflect back to its original unbiased position when the vertical normal force is removed from the contact beam 112.

Additionally, because the contact beam 112 absorbs a torsional force as well as a cantilever force, the contact beam 112 stores more energy upon deflection than if it absorbed only a cantilever force. By storing additional energy, the contact beam 112 can be deflected along a larger vertical range and, upon being released from the vertical normal force, can release more energy and thus reflect back to its original unbiased position.

Figure 5:
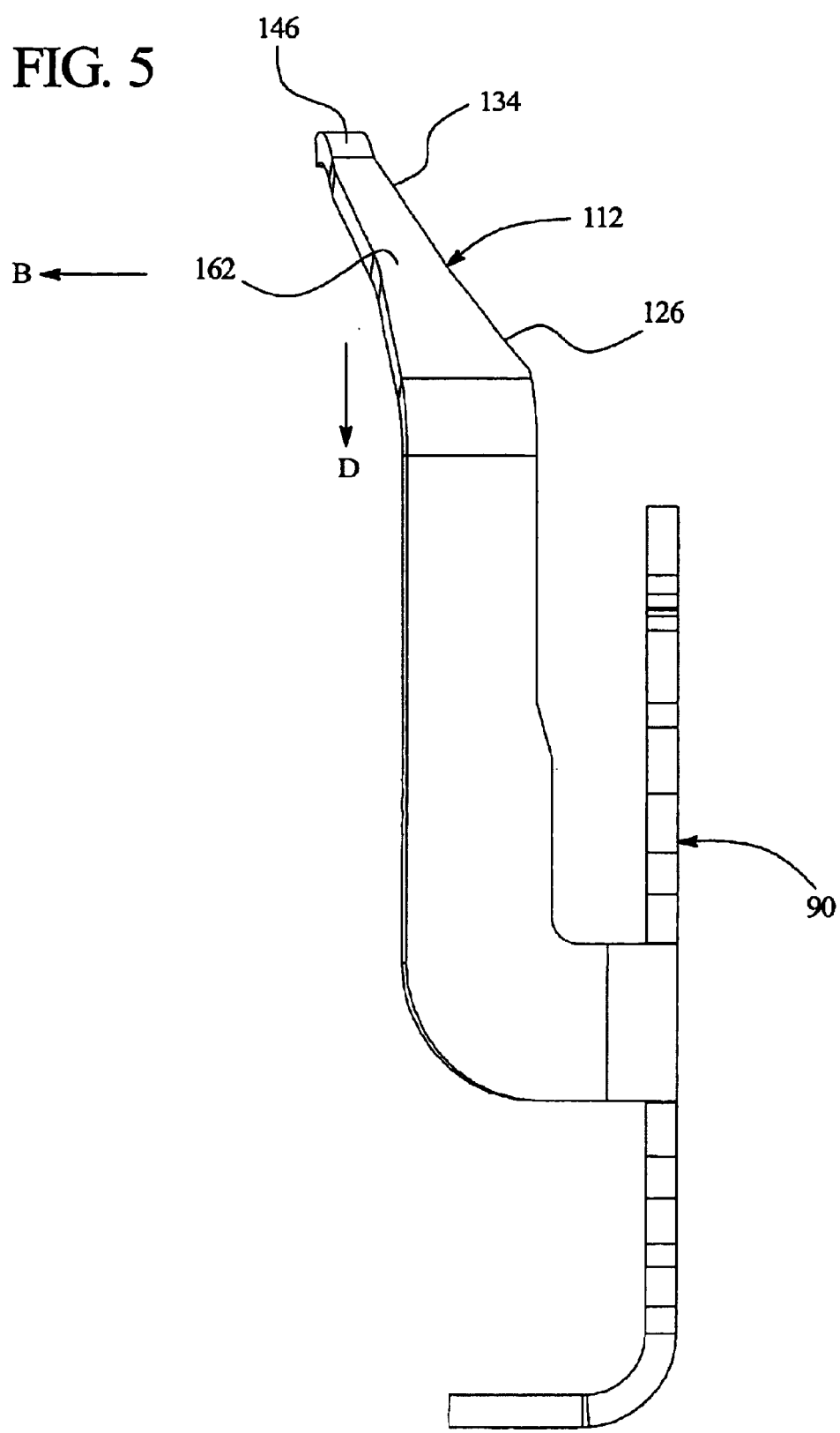
FIG. 5 illustrates a side view of the contact of FIG. 4.
Figure 6:
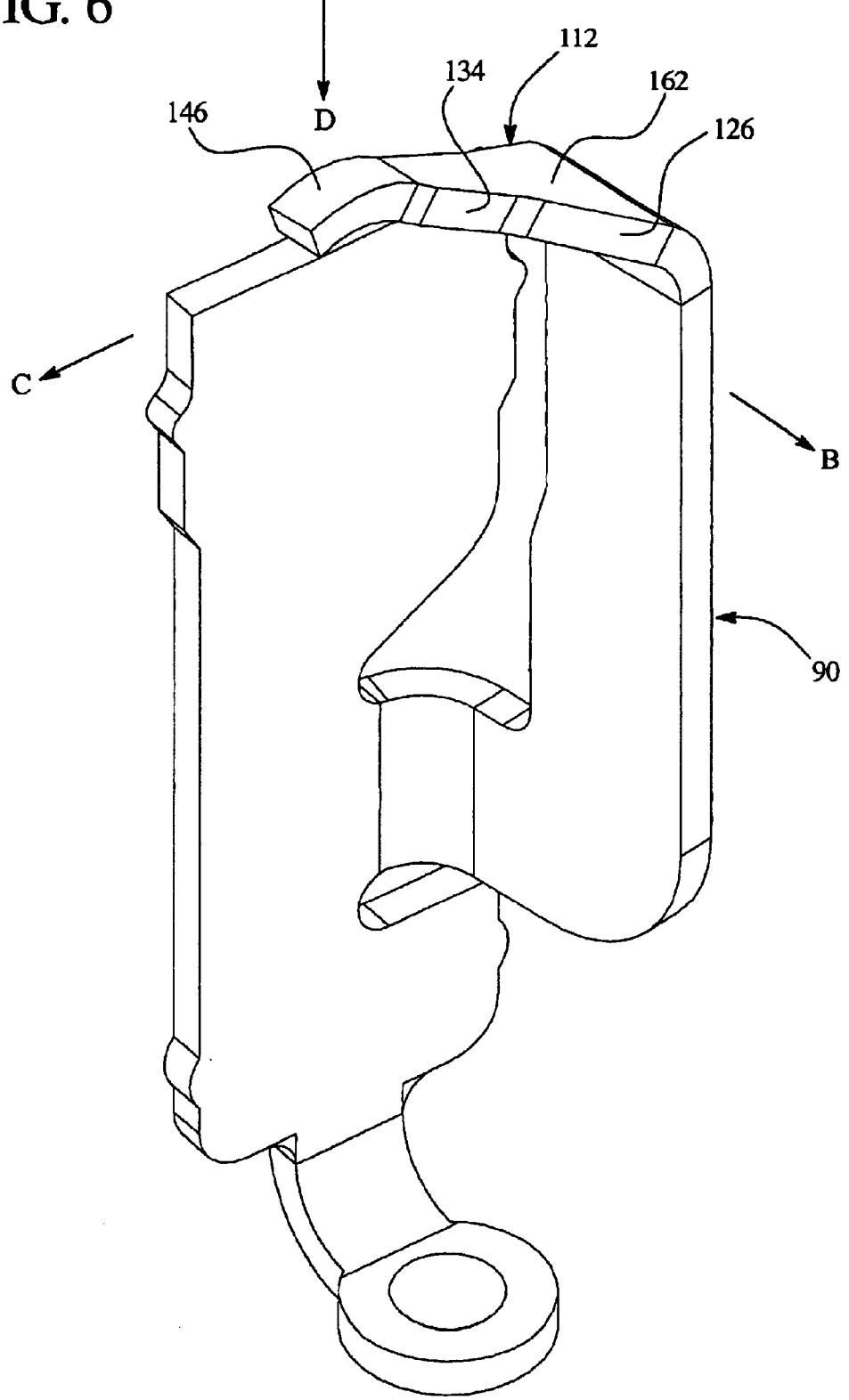
FIG. 6 illustrates an isometric view of a contact formed according to an embodiment of the present invention.

FIG. 5 illustrates a side view of the contact 90 of FIG. 4 and FIG. 6 illustrates an isometric view of the contact 90 of FIG. 4. As shown, the first and second segments 126 and 134 of the contact beam 112 share a common upper surface 162 aligned along a plane. In operation, when the processor 18 (FIG. 1) is positioned on top of the contact 90, the vertical normal force applied by the processor 18 on the contact tip 146 deflects the contact beam 112 downward in the direction of arrow D, outward in the direction of arrow B, and forward in the direction of arrow C.

FIG. 7 illustrates the contacts 90 when positioned in the holes 86. Each hole 86 accepts a contact and is sized to properly align, secure, and position the contact 90 in the desired location. The processor 18 (FIG. 1) has not yet been positioned on top of the housing 16. Therefore, the contacts 90 are in a non-biased first contact position. When the processor 18 is lowered on top of the housing 16, the processor 18 deflects the contacts beams 112 in the direction of arrow A to a second contact position.

The contact beams 112 extend from a top surface 82 of the housing 16. When the contacts 90 are in the first contact position as shown, the each contact 90 has an unloaded contact height 96 measured from the end of the solder ball 154 to the contact tip 146. When the contacts 90 are deflected to the second contact position, the contacts 90 have a loaded contact height (not shown) that is less than the unloaded contact height 96. At the loaded contact height, the resilient biasing of the contact beams 112 results in a contact force between the contacts 90 and the processor 18. The contacts 90 are selected to provide geometry to meet the impedance, inductance, and capacitance requirements of a specified application.

Figure 8:
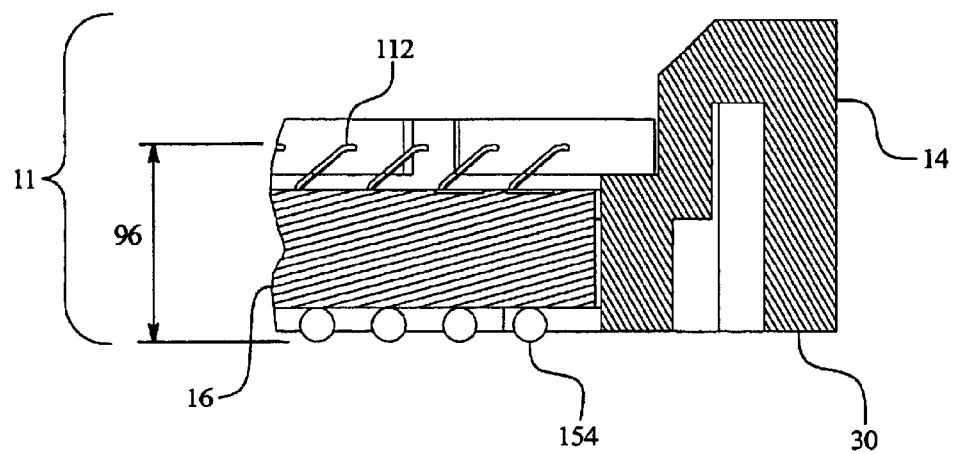
FIG. 8 illustrates a sectional view of a housing and frame formed in accordance with an embodiment of the present invention.

FIG. 8 illustrates a sectional view of the socket 11 before the housing 16 is soldered to the circuit board 12 (FIG. 1). As shown, the housing 16 is lowered into the frame 14 such that the solder balls 154 extend beneath a bottom surface 30 of the frame 14 by a predefined clearance to facilitate soldering the solder balls 154 to the circuit board 12. The contact beams 112 extend upward by the unloaded contact height 96. After the socket 11, with the frame 14 and housing 16 positioned as above described, is oriented and placed on the circuit board 12, the housing 16 may be soldered to the circuit board 12.

Figure 9:
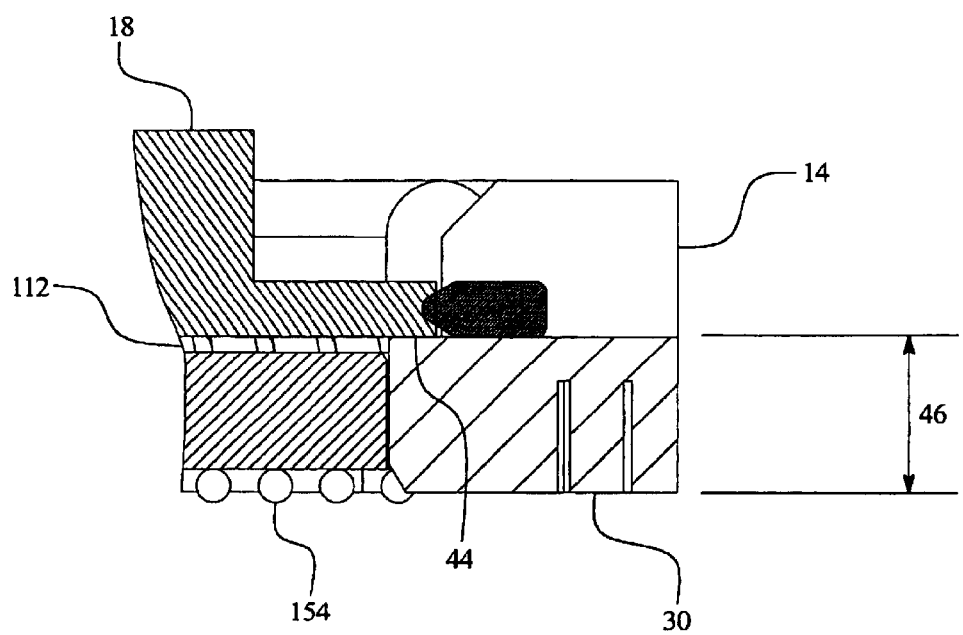
FIG. 9 illustrates a sectional view of a housing and frame formed in accordance with an embodiment of the present invention.

Next, the processor 18 may be placed in the frame 14 as illustrated in FIG. 9. Once the processor 18 is placed within the frame 14, a clamping mechanism (not shown) may be used to force the processor 18 down into the proper position and provide the desired biasing force on the contact beams 112. The clamping mechanism may also include a heat sink. Thus, the clamping mechanism pushes the processor 18 against the contact beams 112 until the processor 18 comes to rest on a shelf 44 of the frame 14. As the processor 18 engages the contact beams 112, the processor 18 delivers the vertical normal force against the contact beams 112 and deflects the contact beams 112. The contacts 90 thus engage both the processor 18 and the circuit board 12 (FIG. 1) and electrically connect the processor 18 and the circuit board 12.

A further applied clamping force will further deflect the contact beams 112 into the second contact position and simultaneously push the frame 14 downward until the bottom surface 30 of the frame 14 abuts against the circuit board 12 (FIG. 1). Any clamping force applied to the processor 18 after the frame 14 is against the circuit board 12 will not result in any further biasing of the contact beams 112 beyond the second contact position. Rather, the force will be transferred to the frame 14 and circuit board 12. Thus, the force seen by the solder balls 154 is controlled and limited to a predetermined level.

The shelf 44 has a shelf height 46 that is sized to allow the contact beams 112 to be biased to the second contact position and no more. This is accomplished by setting the shelf height 46 equal to the vertical distance from the bottom of the solder balls 154 (after reflow) to the contact tips 146 (FIG. 4) when the contact beams 112 are deflected to the second contact position. By way of example, the force used to bias all of the contact beams 112 of the illustrated embodiment may be 65 pounds.

The electrical system 10 of FIG. 1 requires a large vertical range of deflection to accommodate the different tolerances of many different components. Because the contact beams 112 are generally as long as the support body 94 (FIG. 4) and store torsional energy as well as cantilever energy, the contact beams 112 can be deflected across the large vertical range of deflection required by the electrical system 10. Additionally, the length and energy storing capabilities of the contact beams 112 allow the contact beams 112 to reflect back to their original unbiased position. Thus, the contacts 90 (FIG. 4) can be used several times over a long period of time. Finally, the non-perpendicular orientation of the support body 94 and the base portion 106 (FIG. 3) of each contact 90 allows for the contact 90 to be inserted into a smaller hole 86 (FIG. 7). Thus, more contacts 90 can be used in the electrical system 10.

While particular elements, embodiments and applications of the present invention have been shown and described, it will be understood, of course, that the invention is not limited thereto since modifications may be made by those skilled in the art, particularly in light of the foregoing teachings. For example, a different surface other than the bottom surface of the processor may be used to contact the frame, thereby changing the location of the shelf, or using a different contacting surface on the frame to be contacted by the processor. It is therefore contemplated by the appended claims to cover such modifications as incorporate those features which come within the spirit and scope of the invention.

What is claimed is:

1. An electrical contact, comprising:

a support body defining a support body plane, said support body being configured to be held in a hole in a socket such that too and bottom ends of said support body are directed toward a top and a bottom, respectively, of the socket; and a contact beam having a base portion joined to a side edge of side support body, said base portion projecting upward along said side edge of said support body, said base portion extending along a base axis parallel to said support body plane, said base portion having an upper end joined at a deflectable bend with an outer portion of said contact beam, said outer portion being configured to engage an adjoining contact, said outer portion flexing at said bend in a first direction with respect to said base axis and flexing in a second direction about said base axis.

2. The contact of claim 1, further comprising a solder ball pad extending from said bottom end of said support body and configured to carry a solder ball to be reflow soldered to an electronic component, said outer portion moving downward toward said solder ball pad when flexing in said first direction.

3. The contact of claim 1, wherein said base portion and said support body are oriented at a non-normal angle with respect to one another along said side of said support body.

4. The contact of claim 1, wherein said outer portion of said contact beam includes first and second segments oriented at an obtuse angle to one another such that said second segment absorbs a torsional force by flexing in said second direction.

5. The contact of claim 1, wherein said contact beam flexes at said bend to absorb a vertical force delivered parallel to said first direction when an adjoining contact is surface mounted thereon.

6. An electrical contact, comprising:

a support body defining a support body plane, said support body being configured to be held in a hole in socket such that top and bottom ends of said support body are directed toward a top and a bottom, respectively, of the socket, said support body having opposed side edges; and a contact beam having a base portion joined to and projecting upward along one of said side edges, said base portion extending along a base axis, said base portion having an upper end joined at a deflectable bend with an outer portion of said contact beam, said outer portion being configured to engage an adjoining contact, said outer portion projecting from said bend at a first angle with respect to said base axis and at a second angle with respect to said support body plane, wherein an angle of orientation between said base portion and said support body changes when an adjoining contact is surface-mounted on said outer portion of said contact beam.

7. An electrical contact, comprising:

a support body defining a support body plane, said support body being configured to be held in a hole in socket such that top and bottom ends of said support body are directed toward a top and a bottom, respectively, of the socket, said support body having opposed side edges; and a contact beam having a base portion joined to and projecting upward along one of said side edges, said base portion extending along a base axis, said base portion having an upper end joined at a deflectable bend with an outer portion of said contact beam, said outer portion being configured to engage an adjoining contact, said outer portion projecting from said bend at a first angle with respect to said base axis and at a second angle with respect to said support body plane, wherein said base portion of said contact beam defines, a contact base plane oriented at an angle to said support body plane, said angle between said contact base plane and support body plane flexing when an adjoining contact is surface-mounted on said contact beam.

8. An electrical contact, comprising:

a support body defining a support body plane, said support body being configured to be held in a hole in socket such that top and bottom ends of said support body are directed toward a top and a bottom, respectively, of the socket said support body having opposed side edges; and a contact beam having a base portion joined to and projecting upward along one of said side edges, said base portion extending along a base axis, said base portion having an upper end joined at a deflectable bend with an outer portion of said contact beam, said outer portion being configured to engage an adjoining contact, said outer portion projecting from said bend at a first angle with respect to said base axis and at a second angle with respect to said support body plane, wherein said support body has retention bumps extending from said side edges, said retention bumps engaging a socket to retain said support body in a hole in the socket.

9. An electrical socket assembly comprising:

a land grid array (LGA) socket; and a contact having a support body configured to be retained in a hole in said LGA socket such that top and bottom ends of said support body are directed toward a top and a bottom, respectively, of said LGA socket, said support body having an arm extending from a side edge thereof, said arm joining a contact beam to said support body, said contact beam having a base portion projecting upward from said arm and having an outer portion intersecting said base portion at a bend, said outer portion being configured to be loaded by a component mounted to the LGA socket, said bend and said arm flexing in first and second directions, respectively, said first and second directions being oriented normal to one another.

10. The socket assembly of claim 9, further comprising a solder ball pad extending from said bottom end of said support body and configured to carry a solder ball to be reflow soldered to an electrical component.

11. The socket assembly of claim 9, wherein said base portion and said support body are oriented at a non-normal angle with respect to one another along said side edge.

12. The socket assembly of claim 9, wherein said outer portion of said contact beam includes first and second segments formed with each other, said first and second segments being oriented at an obtuse angle to one another such that said second segment absorbs a torsional force from a vertical force delivered by an adjoining contact.

13. The socket assembly of claim 9, wherein said contact beam flexes at said bend to absorb a vertical force delivered when an adjoining contact is surface mounted thereon.

14. The socket assembly of claim 9, wherein said base portion extends along a base axis, and wherein, during surface mounting, said outer portion moves in said first direction which is downward along said base axis and in said second direction which is along an arcuate path about said base axis.

15. An electrical socket assembly, comprising:

a socket; and a contact having a support body configured to be retained in a hole in said socket such that top and bottom ends of said support body are directed toward a top and a bottom, respectively, of said socket said support body having an arm extending from one side edge thereof, said arm joining a contact beam oriented at a first angle with respect to said support body, said contact beam having a base portion projecting upward from said arm alone said side edge and having an outer portion intersecting said base portion at a bend, said outer portion being configured to be loaded by a component mounted to said socket wherein an angle of orientation between said bas portion and said support body changes when an adjoining contact is surface mounted on said outer portion of said contact beam.

16. An electrical socket assembly, comprising:

a socket; and a contact having a support body configured to be retained in a hole in said socket such that top and bottom ends of said support body are directed toward a top and a bottom, respectively, of said socket, said support body having an arm extending from one side edge thereof, said arm joining a contact beam oriented at a first angle with respect to said support body, said contact beam having a base portion projecting upward from said arm along said side edge and having an outer portion intersecting said base portion at a bend, said outer portion being configured to be loaded by a component mounted to said socket wherein said support body has retention bumps extending therefrom, said retention bumps engaging a socket to retain said support body in the socket.

17. An electrical contact, comprising:

a support body configured to be held in an electrical socket such that top and bottom ends of said support body are directed toward a top and a bottom, respectively, of the socket;

a contact beam having a base portion joined with said support body at a curved arm extending from a side edge of said support body, said contact beam having an outer portion joined to said base portion at a bend, said outer portion being configured to be loaded by an adjoining contact, said contact beam deflecting downward at said bend along said support body and outward at said arm away from said support body when said outer portion is loaded.

18. The electrical contact of claim 17, wherein, when said contact beam is loaded by the adjoining contact, said outer portion flexes downward relative to said base portion.

19. The electrical contact of claim 17, wherein, when said contact beam is loaded by the adjoining contact, said outer portion flexes downward relative to said base portion, said outer and base portions flex outward relative to said support body.

* * * * *